(12) United States Patent
Williams et al.

(10) Patent No.: US 8,559,097 B2
(45) Date of Patent: Oct. 15, 2013

(54) INTEGRATED PUMP LASER AND RARE EARTH WAVEGUIDE AMPLIFIER

(75) Inventors: David L. Williams, Menlo Park, CA (US); Andrew Clark, Palo Alto, CA (US); Michael Lebby, Apache Junction, AZ (US)

(73) Assignee: Translucent, Inc., Palo Alto, CA (US)

( * ) Notice: Subject to any disclaimer, the term of this patent is extended or adjusted under 35 U.S.C. 154(b) by 667 days.

(21) Appl. No.: 12/840,538

(22) Filed: Jul. 21, 2010

(65) Prior Publication Data

US 2012/0019902 A1    Jan. 26, 2012

(51) Int. Cl.
*H01S 3/091* (2006.01)
*H01S 5/02* (2006.01)

(52) U.S. Cl.
USPC .......................................... 359/342; 359/344

(58) Field of Classification Search
USPC .......................................... 359/333, 342, 344
See application file for complete search history.

(56) References Cited

U.S. PATENT DOCUMENTS

| | | | | |
|---|---|---|---|---|
| 3,810,688 A | * | 5/1974 | Ballman et al. | 385/2 |
| 2002/0167981 A1 | * | 11/2002 | Eisenbeiser | 372/43 |

* cited by examiner

*Primary Examiner* — Mark Hellner
(74) *Attorney, Agent, or Firm* — Parsons & Goltry; Robert A. Parsons; Michael W. Goltry

(57) ABSTRACT

A light amplifier includes a single crystal semiconductor substrate with a rare earth oxide, light amplifying gain medium deposited on the substrate and formed into a light waveguide, and a pump laser. A lattice matching virtual substrate integrates the pump laser to the gain medium with a first opposed surface crystal lattice matched to the gain medium and second opposed surface crystal lattice matched to the pump laser. The pump laser is positioned with a light output surface coupled to a light input surface of the gain medium so as to introduce pump energy into the light waveguide. The light amplifier has a very small footprint and allows the integration of control and monitoring electronics.

26 Claims, 4 Drawing Sheets

INTEGRATED PUMP LASER AND RARE EARTH WAVEGUIDE AMPLIFIER

FIELD OF THE INVENTION

This invention relates to light amplifiers and more particularly, to the integration of pump lasers with rare earth oxide doped waveguide amplifiers to reduce the footprint.

BACKGROUND OF THE INVENTION

Erbium doped waveguide lasers are known in the art. Basically, a pump laser injects (pumps) 980 nm light into an Erbium doped waveguide carrying a light signal at for example 1550 nm. The Erbium doped waveguide substantially absorbs the 980 nm light and converts it to 1550 nm or amplifies the light signal. Thus, the Erbium doped waveguide is an amplifier of the light signal, i.e. an Erbium doped waveguide amplifier (EDWA).

A major problem with the prior art EDWA is that the pump laser is bonded to the Erbium doped waveguide by either wafer bonding or by bump bonding. In either bonding method, the footprint of the final product and the amount of labor and process steps required are greatly increased. Also, incorporating electronics for controlling, monitoring, etc. is difficult and the incorporation results in inefficient operation.

It would be highly advantageous, therefore, to remedy the foregoing and other deficiencies inherent in the prior art.

An object of the present invention is to provide a new and improved integrated pump laser and rare earth oxide waveguide amplifier.

Another object of the present invention is to provide a integrated pump laser and rare earth oxide waveguide amplifier producing a substantially smaller footprint.

Another object of the present invention is to provide a integrated pump laser and rare earth oxide waveguide amplifier that requires fewer integration steps and less labor and cost.

Another object of the present invention is to provide a integrated pump laser and rare earth oxide waveguide amplifier that easily accommodates the incorporation of control and monitoring electronics.

Another object of the present invention is to provide a new and improved method of integrating a pump laser and rare earth oxide waveguide amplifier.

Another object of the present invention is to provide a new and improved method of integrating a pump laser and rare earth oxide waveguide amplifier that is simpler and cheaper to perform.

SUMMARY OF THE INVENTION

Briefly, to achieve the desired objects and aspects of the instant invention in accordance with a preferred embodiment thereof provided is a light amplifier including a rare earth oxide, light amplifying gain medium formed into a light waveguide with a light input surface. A pump laser having a light output surface is integrated on the gain medium with a lattice matching virtual substrate. A first opposed surface of the virtual substrate is crystal lattice matched to the gain medium and a second opposed surface is crystal lattice matched to the pump laser. The pump laser is positioned with the light output surface adjacent the light input surface of the gain medium so as to introduce pump energy into the light waveguide.

The desired objects and aspects of the instant invention are further achieved in accordance with a preferred method of fabricating a light amplifier including the step of providing a rare earth oxide, light amplifying gain medium formed into a light waveguide with a light input surface. The method further includes a step of growing a lattice matching virtual substrate on the light amplifying gain medium. The lattice matching virtual substrate is substantially crystal lattice matched to the light amplifying gain medium and the virtual substrate has an opposed surface. The method further includes a step of growing a pump laser on the opposed surface of the light amplifying medium. The opposed surface of the light amplifying medium is crystal lattice matched to the pump laser. The pump laser is further positioned with a light output surface adjacent the light input surface of the gain medium so as to introduce pump energy into the light waveguide. In this preferred method the various components are epitaxially grown on a semiconductor substrate and many or all of the various layers can be grown in situ in an epitaxial chamber (i.e. without removing the device between steps).

By integrating the light amplifier, other electronic components, such as control and/or monitoring apparatus, can be integrated with the light amplifier to greatly improve fabricating techniques and interconnections and to substantially reduce the overall footprint of the light amplifier and also any other integrated components.

BRIEF DESCRIPTION OF THE DRAWINGS

Specific objects and advantages of the instant invention will become readily apparent to those skilled in the art from the following detailed description of a preferred embodiment thereof taken in conjunction with the drawings, in which.

DETAILED DESCRIPTION OF THE PREFERRED EMBODIMENT

Figure 1:
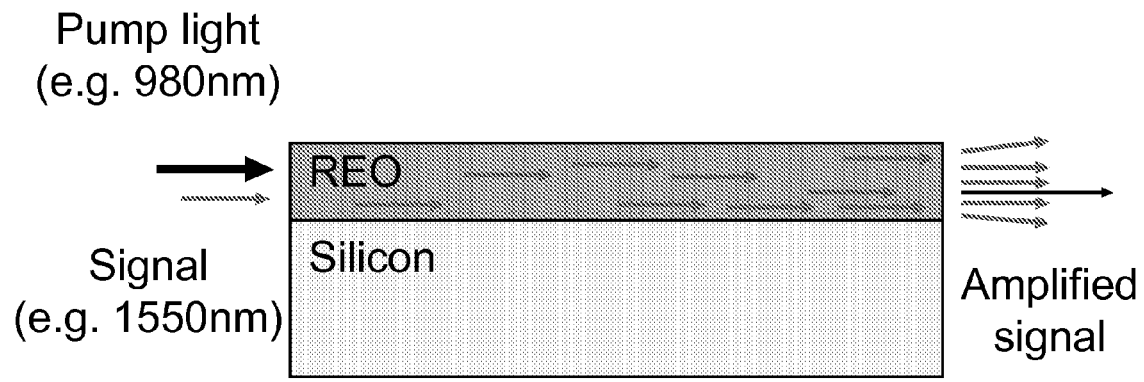
FIG. 1 is a simplified side view of a prior art longitudinally pumped EDWA.
Figure 2:
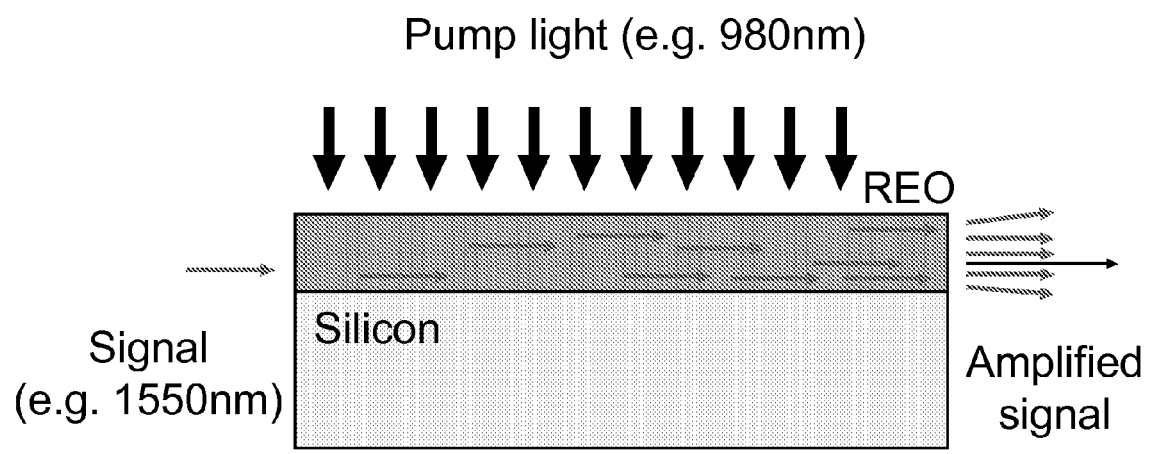
FIG. 2 is a simplified side view of a prior art vertically pumped EDWA.

Turning now to the drawings, attention is first directed to FIGS. 1 and 2, which illustrate prior art longitudinally and vertically pumped Erbium Doped Waveguide Amplifiers (EDWAs), respectively. In each of these applications the pump laser, not shown, is attached to the EDWA by bump bonding or wafer bonding. As understood by artisans, the pump laser is fabricated on a separate substrate with individual or discrete pump lasers bonded to an EDWA in a separate and relatively complicated process.

The wafer bonding process involves fabricating the pump laser on the surface of a separate substrate. The pump laser output surface is then brought into contact with the surface of the EDWA and forms a molecular bond through a well known process, referred to in the industry as Van der Waal's bonding. The substrate carrying the pump laser is then partially removed by any of several different methods to reduce the overall bulk of the final product. The entire process is very labor intensive and of necessity results in an EDWA with a relatively large footprint.

In the bump bonding process the pump laser is fabricated on the surface of a separate substrate. Small balls of solder are then positioned on one of the laser output surface and the surface of the EDWA. The two separate devices are then brought together and heated slightly to partially melt the solder balls and physically attach the two devices together. Again, the entire process is very labor intensive and of necessity results in an EDWA with a relatively large footprint.

Also, in each process it is difficult and very inconvenient to fabricate and attach controlling or monitoring electronic components. For example, in many or even most applications it is desirable to provide a semiconductor light sensing diode adjacent the laser to feedback signals indicating light intensity (light output) and use the signals to control the laser output. Fabricating the pump laser as a discrete device and attaching it to the EDWA by wafer bonding or bump bonding makes fabrication of the monitoring diode very difficult if not impossible. Note for example that the rear side of the laser is covered by the substrate. Thus, controlling and/or monitoring electronics must be fabricated separately and attached or connected by some additional process.

Figure 3:
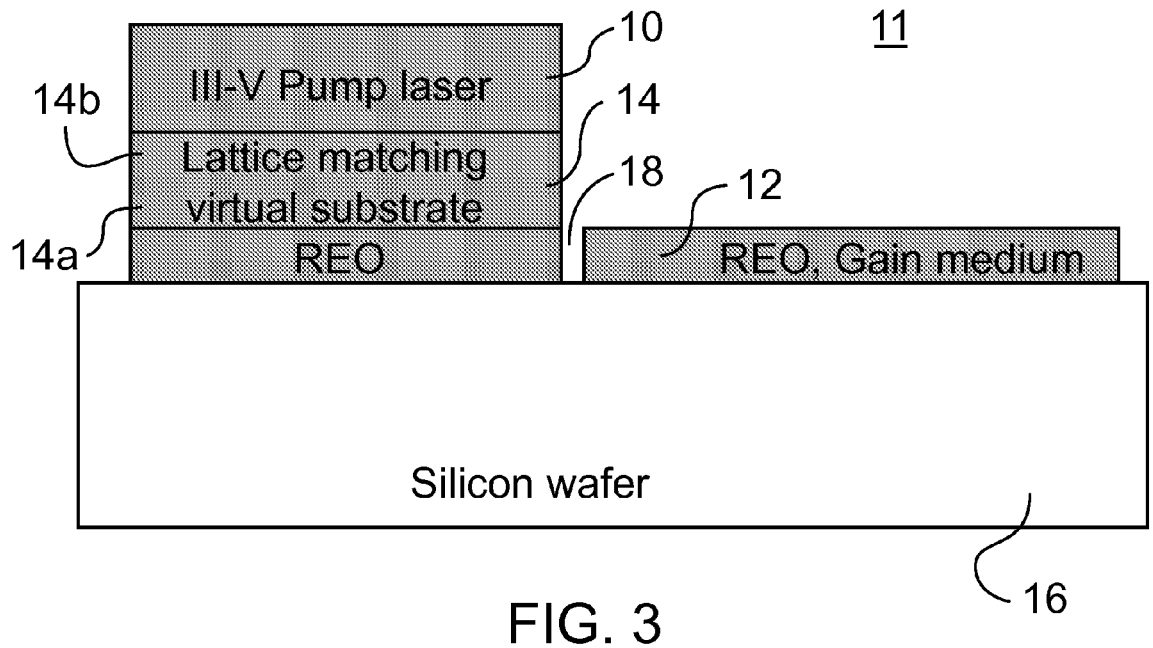
FIG. 3 is a simplified side view of a vertically pumped EDWA in accordance with the present invention.

To overcome all or substantially all of these problems a light amplifier is fabricated by lattice matching a pump laser directly to a rare earth oxide gain medium either to provide vertical pumping or horizontal pumping into the medium. Referring specifically to FIG. 3, an example of a light amplifier 11 that includes a III-V pump laser 10 in a vertical pumping system is illustrated. Pump laser 10 is lattice matched directly to a rare earth oxide medium 12 by a lattice matching virtual substrate 14 in accordance with the present invention. While pump laser 10 will preferably be a semiconductor laser, such as a vertical cavity surface emitting laser (VCSEL) with reflecting stacks including two or three element components (III-V elements), it will be understood that other light pump emitting devices such as LEDs, RCLEDs, and other type lasers might be used. The multi-element component VCSEL is preferred because of the popularity in the industry (i.e. well developed manufacturing techniques), the ease of fabrication, and the ease of integration with other electronic components.

Illustrated in FIG. 3 is a semiconductor wafer 16 (preferably silicon) which, as understood by the artisan is a single crystal semiconductor bulk material. Single crystal rare earth oxide waveguide 12 (such as the known EDWA or other rare earth oxide waveguides) is deposited on substrate 16 in a desired pattern or patterns extending, for example, from a source of signal to be amplified or an input terminal to a receiver of the amplified signal or an output terminal. In one or more regions on the surface of waveguide 12, depending upon the pump laser or lasers to be used, lattice matching virtual substrate 14 is deposited. For a better understanding of the explanation given below, virtual substrate 14 is designated as including a lower layer 14a and an upper layer 14b, whereas actually because of the deposition process virtual substrate 14 is a single continues layer of different materials. Also, the crystal lattice spacing of waveguide 12 is generally similar to the crystal lattice spacing of silicon wafer 16 so that very little strain is created between the waveguide 12 and substrate 16 since they are effectively lattice matched.

Basically, single crystal oxides of rare earth and the like (generally IIIB elements) are deposited as transition layers 14a and 14b between single crystal rare earth oxide waveguide 12 and a single crystal outer layer of higher bandgap material on the surface of pump laser 10. Here it should be understood that the term "single crystal" is used to denote crystalline silicon grown or formed as a single continuous crystal well known in the art. Generally, silicon and similar crystalline materials have a cubic crystal structure and many of the higher bandgap materials, such as the multi-element components of most lasers, have a hexagonal crystal structure. To allow the continuous single crystal growth (i.e. integration) of pump laser 10, first transition layer 14a of an oxide of rare earth or the like is chosen from a material having a cubic crystal structure. The different crystal orientations for rare earth oxides (lanthanides) are described and illustrated in a copending U.S. patent application entitled "High Efficiency Solar Cell Using IIIB Material Transition Layers", filed 19 Feb., 2010, assigned Ser. No. 12/708,969, and incorporated herein by reference.

Second layer 14b of an oxide of rare earth or the like is chosen from a material having a hexagonal crystal structure. As an example, $Sc_2O_3$ has a hexagonal crystal structure and a lattice spacing of 3.2 Å so that it is lattice matched to GaN, GaAs, etc. Thus, a single crystal layer included in pump laser 10 of higher bandgap material (e.g. InGaN, InGaAs, GaAs, etc.) can be grown on second single crystal layer 14b with little or no stress or strain in or between layers 14b and pump laser 10. Here it should be understood that stress or strain in the mirror stack or active layers of pump laser 10 can result in defects in the crystal structure and a loss of efficiency or possibly non-operation. Note that small lattice mismatching, e.g. 10% or less, will generally produce small enough stress or strain that will not cause defects in the critical layers.

It will be noted that layers 14a and 14b are adjacent and generally layer 14b is epitaxially grown on layer 14a. To allow the single crystal growth (e.g. layer 14b on layer 14a) to be performed without undue crystal strain and defects, the first material is started at maximum growth and gradually reduced to zero. At approximately a mid point in the reduction of the growth of the first material, the growth of the second material is started from zero and gradually increased to a maximum level. Generally layers 14a and 14b are approximately a thousand angstroms thick with the gradation or gradual change starting at approximately the mid point of each layer. By gradually changing from the cubic crystal structure material to the hexagonal crystal structure material, crystal defects are avoided and both layers 14a and 14b are single crystal material at the junctions with waveguide 12 and pump laser 10, respectively. Also, virtual substrate 14 is fabricated from material that does not absorb light at the pump wavelength, in the above specific example 980 nm.

Thus, a III-V pump laser can be grown directly on the surface of rare earth oxide medium 12 without requiring extra bonding processes or steps. One major advantage realized because of the direct growth process is that all or substantially all of the illustrated structure can be grown on silicon wafer 16 in situ, or without the need to remove the structure from the epitaxial chamber between steps. Also, because the structure is completely integrated the footprint (overall area of the device) is substantially reduced and allows much smaller size devices to be fabricated. A light source or optical amplifier with a footprint as small as 1.5 microns is easily possible.

A small gap, designated 18, is illustrated between the portion of rare earth oxide medium 12 on which lattice matching virtual substrate 14 is deposited and the remainder of the waveguide. Gap 18 is optional but is included to prevent any inadvertent transmission of the light signal carried by the waveguide from being communicated back to pump laser 10.

Generally gap 18 is small enough to not reduce the pumped light in any measurable amount but will substantially reduce or prevent the reverse passage of the smaller light signal.

Figure 4:
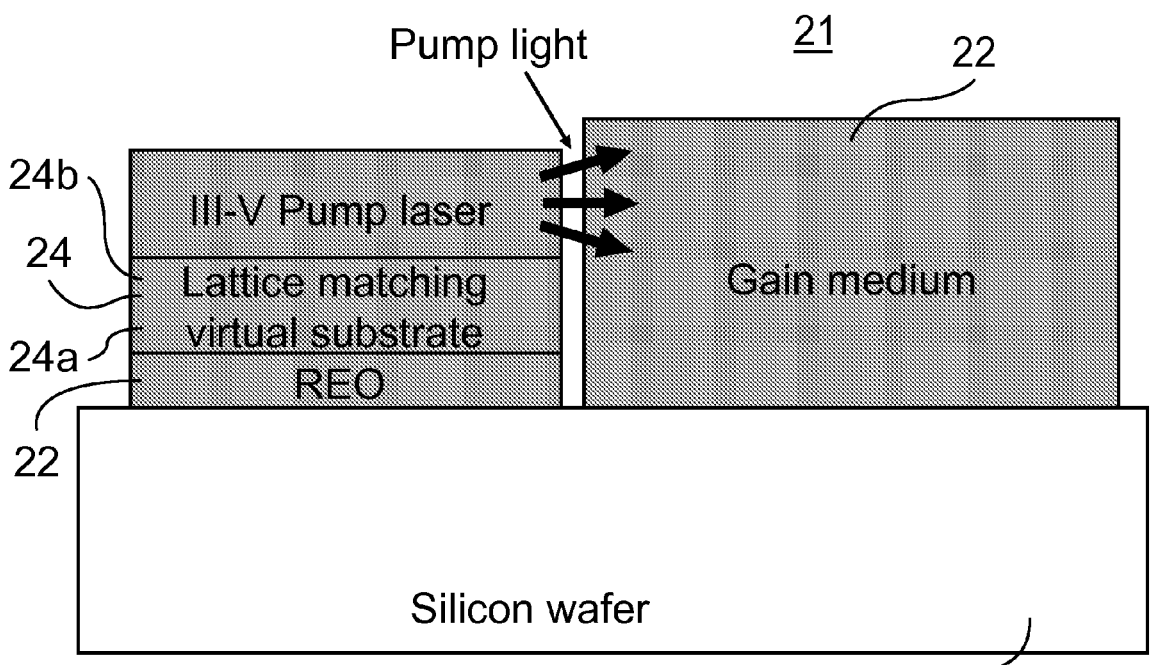
FIG. 4 is a simplified side view of a longitudinally pumped rare earth light amplifier in accordance with the present invention.

Turning additionally to FIG. 4, light amplifier 21 in accordance with the present invention is illustrated integrating a pump laser 20 in a horizontal pumping system. A silicon wafer 26 which, as understood by the artisan is a single crystal silicon bulk material is illustrated. A single crystal rare earth oxide waveguide 22 is deposited on substrate 26 in a desired pattern or patterns extending, for example, from a source of signal to be amplified or an input terminal to a receiver of the amplified signal or an output terminal. In one or more regions on the surface of waveguide 22, depending upon the pump laser or lasers to be used, lattice matching virtual substrate 24, including layers 24a and 24b as explained above, is deposited. Also, the crystal lattice spacing of waveguide 22 is generally similar to the crystal lattice spacing of silicon wafer 26 so that very little strain is created between the waveguide 22 and substrate 26 since they are effectively lattice matched.

The major difference between the devices illustrated in FIG. 3 and FIG. 4 is pump laser 20. In the device of FIG. 4, pump laser 20 is an end emitting laser rather than a surface emitting laser. Thus, pump laser 20 emits pump energy horizontally into gain medium 22. Also, gain medium 22 is fabricated with a greater depth so that it extends upwardly into horizontal alignment with the emitting end of pump laser 20. However, in the device illustrated in FIG. 4, pump laser 20 is formed of single crystal layers epitaxially grown as explained above on gain medium 22 to integrate the components automatically during the growth or fabrication process.

Figure 5:
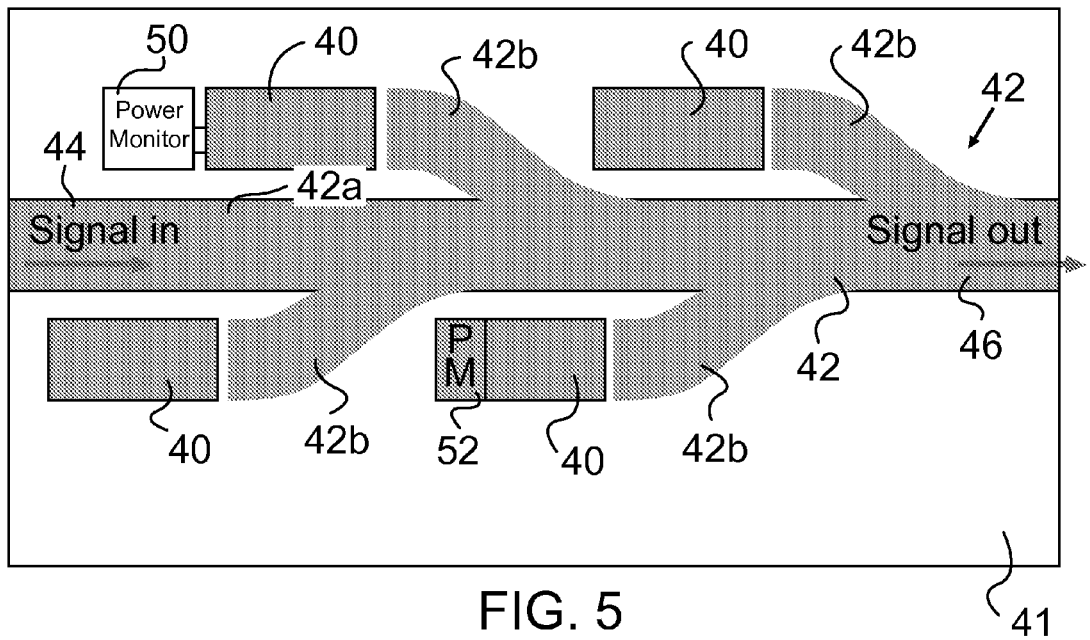
FIG. 5 is a simplified top plan view of a rare earth light amplifier wherein multiple pump lasers drive a common rare earth light waveguide.

Turning additionally to FIG. 5, a simplified top plan view of multiple pump lasers 40 (four in this example) driving a common integrated single crystal rare earth oxide waveguide 42 is illustrated. As explained in conjunction with the systems depicted in FIGS. 3 and 4, common integrated waveguide 42 is a single crystal rare earth oxide active amplifying material (e.g. Erbium oxide or other rare earth material) deposited on a single crystal wafer or chip 41 of semiconductor material such as silicon. In this specific example, common integrated waveguide 42 includes a main waveguide path or backbone 42a, extending from a light signal input 44 at the left-hand side of FIG. 5 to a light signal output 46 at the right-hand side of FIG. 5, and a plurality of pump waveguide inlets 42b. Each pump waveguide inlet 42b is formed to guide the pump energy from an integrated pump laser 40 into the main waveguide path 42a to mix with and amplify the light signal as it passes from light signal input 44 to light signal output 46. Each pump laser 40 is integrated on an associated pump waveguide inlet by either the vertical pumping system or the horizontal pumping system although the specific example illustrated in FIG. 5 is designed primarily for incorporating horizontal pumping systems.

In another multiple pump laser concept, pump lasers could be mounted directly on main waveguide path 42a and spaced apart along the length thereof in a vertical pumping system. In either system the complexity of the fabrication process and the amount of labor and cost is substantially reduced since the multiple pump lasers can be fabricated simultaneously in the epitaxial process. It should also be noted that in either the multiple horizontal pumping system or the multiple vertical pumping system the overall footprint is substantially reduced.

In either the vertical pumping system (e.g. FIG. 3) or the horizontal pumping system (e.g. FIG. 4) control and/or monitoring electronics can be integrated directly into the illustrated structures. In this concept the control electronics includes any electronics that are required to perform desired functions or tasks. For example, monitoring diodes can be incorporated directly onto or associated closely with each pump laser and additional control electronics can be incorporated to control the pump laser power output. Also, the control electronics can integrate one or more pump lasers and rare earth oxide amplifying waveguides to form, for example, light transmitters and receivers.

As illustrated in FIG. 5, power and/or monitoring electronics 50 can be integrated onto the silicon wafer 41 or the rare earth waveguide 42 adjacent to and in electrical communication with one or all of pump lasers 40 (only one illustrated). In addition to or instead of electronics 50, power and/or monitoring electronics 52 can be fabricated directly onto a surface of one or all of pump lasers 40 (only one illustrated). In this fashion all or substantial portions of control and monitoring electronics can be fabricated in the same process steps used to fabricate the laser pump and rare earth oxide amplifying waveguide.

Figure 6:
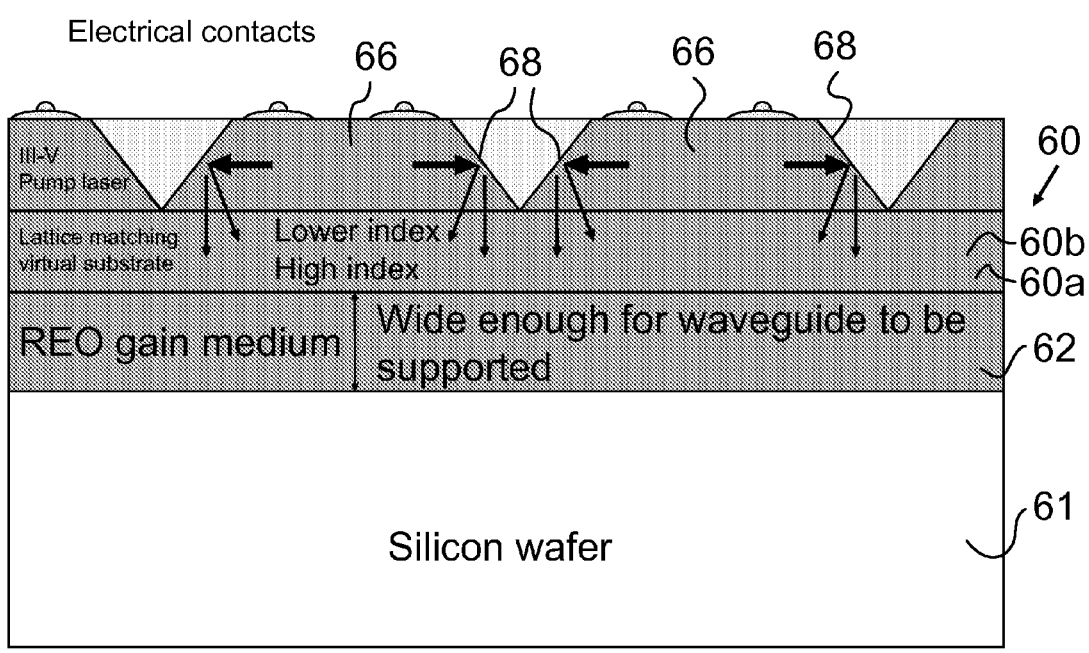
FIG. 6 is a simplified side view of a vertically pumped rare earth light amplifier illustrating an example of a lattice matching virtual substrate.

Turning to FIG. 6, one integration example of a lattice matching virtual substrate, designated 60 and the rare earth oxide gain medium, designated 62, is illustrated. Single crystal rare earth oxide gain medium 62 is deposited on a single crystal semiconductor wafer 61 (e.g. a silicon wafer) with sufficient depth and/or width to support a waveguide mode of operation. Single crystal oxides of rare earth and the like (generally IIIB elements) are deposited as transition layers 60a and 60b between single crystal rare earth oxide waveguide 62 and a single crystal outer layer of higher bandgap material on the surface of pump lasers 66.

In this example, pump lasers 66 are illustrated as horizontally emitting lasers with reflecting surfaces 68 directing the emitted energy vertically downward. In this specific example, multiple lasers can be deposited simultaneously and separated into individual lasers by etching channels therebetween. The channel side surfaces can then be coated with reflecting material if required.

As explained above, transition layer 60a is selected to be crystal lattice matched to rare earth oxide waveguide 62 and transition layer 60b is selected to be crystal lattice matched to the lower surface of pump lasers 66. Also, transition layer 60a is selected with an index of refraction that is higher than the index of refraction of transition layer 60b. In this fashion the two transition layers effectively form a mirror pair (similar to mirror pairs used in reflecting stacks of lasers) or light barrier that reflects light or substantially prevents light from leaving (i.e. containing light in) waveguide 62. By placing the higher index material adjacent waveguide 62 and the lower index material adjacent pump lasers 66 light energy freely travels downward into waveguide 62 but is substantially prevented from reflecting back into pump lasers 66. Also, virtual substrate 60 is fabricated from material that does not absorb light at the pump wavelength, for example 980 nm.

Figure 7:
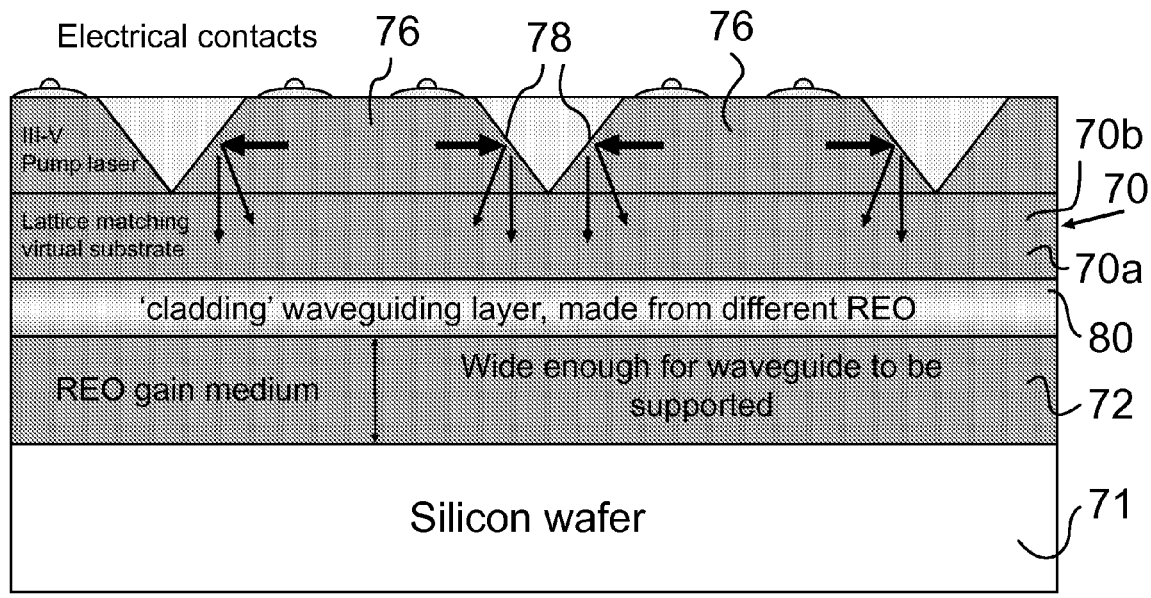
FIG. 7 is a simplified side view of a vertically pumped rare earth light amplifier illustrating another example of a lattice matching virtual substrate.

Turning to FIG. 7, another integration example of a lattice matching virtual substrate, designated 70 and a rare earth oxide gain medium, designated 72, is illustrated. Single crystal rare earth oxide gain medium 72 is deposited on a single crystal semiconductor wafer 71 (e.g. a silicon wafer) with sufficient depth and/or width to support a waveguide mode of operation. In this embodiment a thin (e.g. in a range of 100 Å to several hundred Å) cladding or waveguiding layer 80 is deposited on the surface of gain medium 72. Cladding layer 80 may be, for example, a layer of one or more single crystal rare earth materials crystal lattice matched to gain medium 72 and selected to provide or graded to provide a reduction in refractive index to substantially prevent light from leaving (i.e. containing light in) gain medium 72. Also, cladding layer 80 does not absorb light at the pumped wavelength so that energy transmitted from pump lasers 76 is not absorbed but passes into gain medium 72. In this embodiment, transition layer 70a is selected to be crystal lattice matched to cladding layer 80 and transition layer 70b is selected to be crystal lattice matched to the lower surface of pump lasers 76.

Thus, in either of the integration examples described above the entire structure, including the laser pumps and any associated control and/or monitoring electronics desired, can be fabricated in a substantially continuous or in situ process. Also, because of the integration of the pump laser or lasers with the gain medium the structure has a very small footprint (e.g. 1.5 microns). Further, by integrating some or all of control and/or monitoring electronics onto the same chip or wafer, the final footprint is greatly reduced, interconnecting energies are low, and products such as light transmitters and receivers can be conveniently produced.

Figure 8:
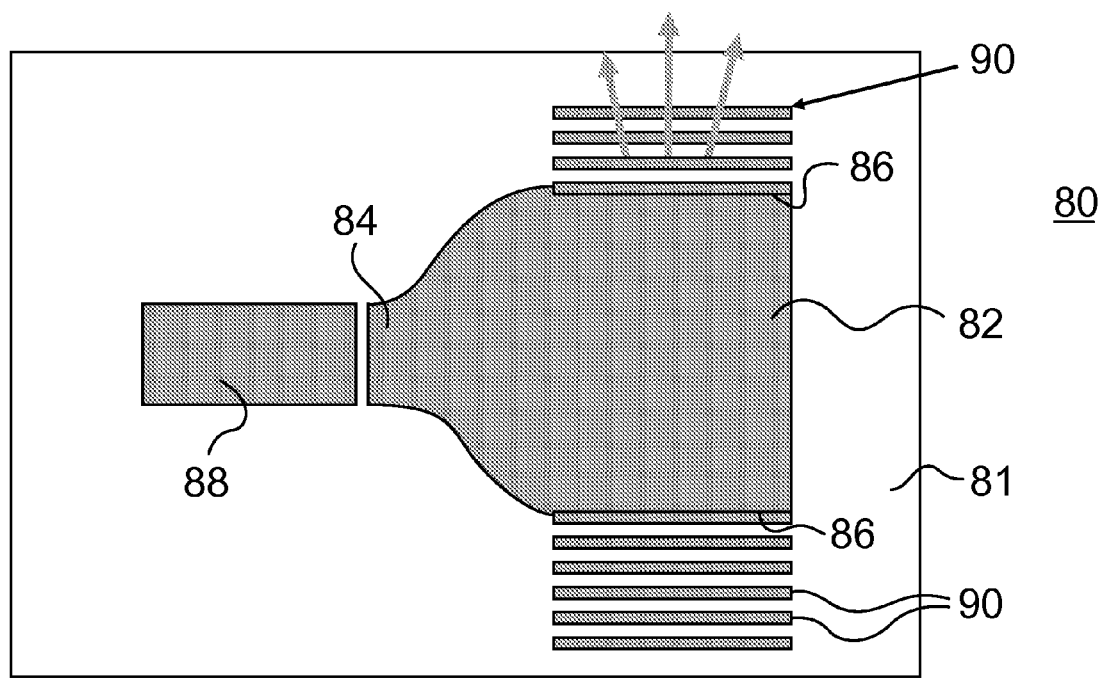
FIG. 8 is a simplified top view of an Erbium based pump laser for use with a rare earth light amplifier.

Turning to FIG. 8, a light source 80 is illustrated that is fabricated using the same techniques described above. In this example a single crystal rare earth oxide gain medium 82 is deposited on a single crystal semiconductor wafer 81 (e.g. a silicon wafer) with sufficient depth and/or width to support a waveguide mode of operation. Gain medium 82 is formed with a necked down light inlet 84 and flared out or fan shaped with parallel, spaced apart sides 86 one of which serves as a light outlet. A simple light source 88, such as a semiconductor LED, is positioned on wafer 81 so as to inject light into light inlet 84. Mirror stacks or distributed Bragg reflectors 90 are positioned on the parallel, spaced apart side surfaces 86 with one of the stacks including fewer reflection surfaces and, thus, serving as a light outlet. Light stacks or distributed Bragg reflectors are will known in the semiconductor laser field and can be for example semiconductor layers deposited directly on the surfaces of the gain medium 82.

Generally, light source 88 is a very simple device and as understood in the art emits light in an omni-directional arc. The omni-directional light strikes the parallel, spaced apart side surfaces 86 of the gain medium and is reflected by mirror stacks 90. The injected light is amplified in gain medium 82 and reflected between mirror stacks 90 in a substantially lasing action. By selecting the rare earth material used in gain medium 82 and by forming the mirror stacks in relation to the desired output wavelength (e.g. each mirror pair of the stacks being one half wavelength thick) a laser or RCLED can be fabricated. Further, a matrix of light sources 80 can be fabricated on a semiconductor chip with the same or different output wavelengths.

Thus, a new and improved light amplifier including an integrated pump laser and rare earth oxide amplifying gain medium waveguide is disclosed. The integrated pump laser and rare earth oxide waveguide amplifier produce a substantially smaller footprint. Also, the light amplifier requires fewer integration steps and less labor and cost. Further, the light amplifier easily accommodates the incorporation of control and monitoring electronics. A new and improved method of integrating a pump laser and rare earth oxide waveguide amplifying medium is disclosed that is simpler and cheaper to perform.

Various changes and modifications to the embodiments herein chosen for purposes of illustration will readily occur to those skilled in the art. To the extent that such modifications and variations do not depart from the spirit of the invention, they are intended to be included within the scope thereof, which is assessed only by a fair interpretation of the following claims.

Having fully described the invention in such clear and concise terms as to enable those skilled in the art to understand and practice the same, the invention claimed is:

1. A light amplifier comprising:
a rare earth oxide, light amplifying gain medium formed into a light waveguide with a light input surface;
a pump laser having a light output surface;
a lattice matching virtual substrate having first and second opposed surfaces, the first opposed surface being substantially crystal lattice matched to the rare earth oxide light amplifying gain medium and the second opposed surface being substantially crystal lattice matched to the pump laser, the pump laser being further positioned with the light output surface adjacent the light input surface of the gain medium so as to introduce pump energy into the light waveguide; and
the lattice matching virtual substrate including a first layer of single crystal rare earth oxide material with a crystal structure and spacing substantially the same as the crystal structure and spacing of the rare earth oxide light amplifying gain medium and a second layer of single crystal rare earth oxide material with a crystal structure and spacing substantially the same as the crystal structure and spacing of an adjacent surface of the pump laser.

2. A light amplifier as claimed in claim 1 wherein the rare earth oxide, light amplifying gain medium is deposited on a single crystal semiconductor substrate.

3. A light amplifier as claimed in claim 2 wherein the semiconductor substrate includes silicon.

4. A light amplifier as claimed in claim 3 further including control and monitoring electronics fabricated on the silicon substrate and in electrical communication with the pump laser.

5. A light amplifier as claimed in claim 1 wherein the rare earth oxide, light amplifying gain medium includes Erbium oxide.

6. A light amplifier as claimed in claim 1 wherein the pump laser includes a III-V material.

7. A light amplifier as claimed in claim 1 wherein the pump laser light output surface is a horizontal output parallel with the plane of the light waveguide.

8. A light amplifier as claimed in claim 1 wherein the pump laser light output surface is a vertical output generally in a direction perpendicular to the plane of the light waveguide.

9. A light amplifier as claimed in claim 1 wherein the lattice matching virtual substrate includes a relatively high index of refraction material adjacent the first opposed surface and a relatively low index of refraction material adjacent the second opposed surface.

10. A light amplifier as claimed in claim 1 further including a single crystal cladding layer positioned between the light amplifying gain medium and the lattice matching virtual substrate.

11. A light amplifier as claimed in claim 10 wherein the single crystal cladding layer includes material graded from a relatively high index of refraction adjacent the light amplifying gain medium to a relatively low index of refraction adjacent the first opposed surface of the lattice matching virtual substrate.

12. A light amplifier comprising:
a single crystal semiconductor substrate;
a rare earth oxide, light amplifying gain medium deposited on the semiconductor substrate and formed into a light waveguide with a light input surface;
a pump laser having a light output surface; and
a lattice matching virtual substrate including a first layer of single crystal rare earth oxide material with a crystal structure and spacing substantially the same as the crystal structure and spacing of the light amplifying gain medium and a first opposed surface and a second layer of single crystal rare earth oxide material with a crystal structure and spacing substantially the same as the crystal structure and spacing of an adjacent surface of the pump laser and a second opposed surface, the lattice matching virtual substrate integrating the light amplifying gain medium and the pump laser with the first opposed surface being substantially crystal lattice matched to the light amplifying gain medium and the second opposed surface being substantially crystal lattice matched to the pump laser, the pump laser being further positioned with the light output surface coupled to the light input surface of the gain medium so as to introduce pump energy into the light waveguide.

13. A light amplifier as claimed in claim 12 wherein the semiconductor substrate includes silicon.

14. A light amplifier as claimed in claim 13 further including control and monitoring electronics fabricated on the silicon substrate and in electrical communication with the pump laser.

15. A light amplifier as claimed in claim 12 wherein the pump laser light output surface is a horizontal output parallel with the plane of the light waveguide.

16. A light amplifier as claimed in claim 12 wherein the pump laser light output surface is a vertical output generally in a direction perpendicular to the plane of the light waveguide.

17. A light amplifier as claimed in claim 12 wherein the lattice matching virtual substrate includes a relatively high index of refraction material adjacent the first opposed surface and a relatively low index of refraction material adjacent the second opposed surface.

18. A light amplifier as claimed in claim 12 further including a single crystal cladding layer positioned between the light amplifying gain medium and the lattice matching virtual substrate.

19. A light amplifier as claimed in claim 18 wherein the single crystal cladding layer includes material graded from a relatively high index of refraction adjacent the light amplifying gain medium to a relatively low index of refraction adjacent the first opposed surface of the lattice matching virtual substrate.

20. A method of fabricating a light amplifier comprising the steps of:
providing a rare earth oxide, light amplifying gain medium formed into a light waveguide with a light input surface;
growing a lattice matching virtual substrate on the light amplifying gain medium, the lattice matching virtual substrate being substantially crystal lattice matched to the light amplifying gain medium, the virtual substrate having an opposed surface, and growing the lattice matching virtual substrate including growing a first material of single crystal rare earth oxide with a crystal structure and spacing substantially the same as the crystal structure and spacing of the rare earth oxide light amplifying gain medium and a second material of single crystal rare earth oxide with a crystal structure and spacing substantially the same as the crystal structure and spacing of an adjacent surface of the pump laser; and
growing a pump laser on the opposed surface of the light amplifying medium, the opposed surface of the light amplifying medium being crystal lattice matched to the pump laser, the pump laser being further positioned with a light output surface adjacent the light input surface of the gain medium so as to introduce pump energy into the light waveguide.

21. A method as claimed in claim 20 wherein the step of growing the lattice matching virtual substrate includes graduating from the first material to the second material in a common layer.

22. A method as claimed in claim 20 wherein the step of growing the lattice matching virtual substrate and the step of growing a pump laser both include epitaxially growing.

23. A method as claimed in claim 20 wherein the step of growing the lattice matching virtual substrate and the step of growing a pump laser epitaxially are performed in situ in an epitaxial chamber.

24. A method as claimed in claim 20 wherein the step of growing the lattice matching virtual substrate includes growing a relatively high index of refraction material adjacent the light amplifying gain medium and a relatively low index of refraction material adjacent the opposed surface.

25. A method as claimed in claim 20 further including a step of growing a single crystal cladding layer between the light amplifying gain medium and the lattice matching virtual substrate.

26. A method as claimed in claim 25 wherein the step of growing the single crystal cladding layer includes grading the cladding layer from a material with a relatively high index of refraction adjacent the light amplifying gain medium to a material with a relatively low index of refraction adjacent the first opposed surface of the lattice matching virtual substrate.

* * * * *